(12) United States Patent
Yamada

(10) Patent No.: US 9,054,170 B2
(45) Date of Patent: Jun. 9, 2015

(54) SEMICONDUCTOR DEVICE, METHOD FOR MANUFACTURING THE SAME, POWER SUPPLY, AND HIGH-FREQUENCY AMPLIFIER

(71) Applicant: FUJITSU LIMITED, Kawasaki-shi, Kanagawa (JP)

(72) Inventor: Atsushi Yamada, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 38 days.

(21) Appl. No.: 14/066,036

(22) Filed: Oct. 29, 2013

(65) Prior Publication Data

US 2014/0175453 A1    Jun. 26, 2014

(30) Foreign Application Priority Data

Dec. 21, 2012    (JP) ................................ 2012-279707

(51) Int. Cl.
| | |
|---|---|
| *H01L 29/778* | (2006.01) |
| *H01L 21/8252* | (2006.01) |
| *H01L 29/66* | (2006.01) |
| *H01L 27/06* | (2006.01) |
| *H01L 29/20* | (2006.01) |

(52) U.S. Cl.
CPC ......... *H01L 29/7785* (2013.01); *H01L 29/2003* (2013.01); *H01L 29/7787* (2013.01); *H01L 21/8252* (2013.01); *H01L 29/66462* (2013.01); *H01L 27/0605* (2013.01); *H01L 2224/0603* (2013.01); *H01L 2224/48247* (2013.01); *H01L 2224/48257* (2013.01); *H01L 2224/48472* (2013.01); *H01L 2224/4903* (2013.01); *H01L 2924/13091* (2013.01)

(58) Field of Classification Search
CPC ..................... H01L 21/8252; H01L 29/66462; H01L 29/7787; H01L 29/0605; H01L 29/6063; H01L 29/872; H01L 29/2003; H01L 29/0692; H01L 27/0629; H01L 27/0883
See application file for complete search history.

(56) References Cited

U.S. PATENT DOCUMENTS

| | | | | | |
|---|---|---|---|---|---|
| 4,615,102 | A | * | 10/1986 | Suzuki et al. | 438/172 |
| 5,043,776 | A | * | 8/1991 | Hida | 257/272 |
| 2004/0157355 | A1 | | 8/2004 | Kachi et al. | |
| 2009/0057720 | A1 | | 3/2009 | Kaneko | |
| 2009/0065810 | A1 | * | 3/2009 | Honea et al. | 257/192 |

(Continued)

FOREIGN PATENT DOCUMENTS

| | | |
|---|---|---|
| JP | 2004-260140 A1 | 9/2004 |
| JP | 2007-19309 A1 | 1/2007 |

(Continued)

*Primary Examiner* — Victor A Mandala
*Assistant Examiner* — Quovaunda V Jefferson
(74) *Attorney, Agent, or Firm* — Kratz, Quintos & Hanson, LLP

(57) ABSTRACT

A semiconductor device includes: a first transistor that includes a first gate electrode, a first source electrode, a first drain electrode, and a first nitride semiconductor laminate that includes a first electron transit layer and a first electron supply layer; a second transistor that includes a second gate electrode, a second source electrode, a second drain electrode, and a second nitride semiconductor laminate that includes a second electrode transit layer and a second electron supply layer, the second drain electrode being a common electrode that also serves as the first source electrode, the second electron transit layer having part that underlies the second gate electrode and that contains a p-type dopant; and a p-type-dopant-diffusion-blocking layer.

18 Claims, 9 Drawing Sheets

(56) References Cited

U.S. PATENT DOCUMENTS

2009/0121775 A1    5/2009  Ueda et al.
2013/0256829 A1*  10/2013  Kikkawa ................. 257/506

FOREIGN PATENT DOCUMENTS

| JP | 2009-76845 | A1 | 4/2009 |
| WO | WO 2010/016564 | A1 | 2/2010 |

* cited by examiner

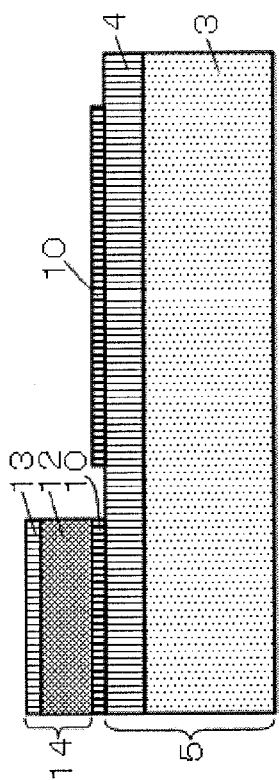
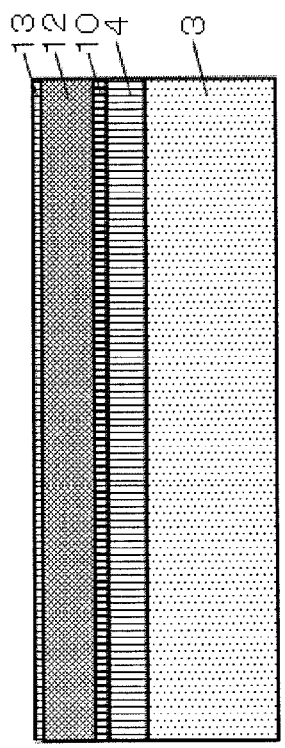
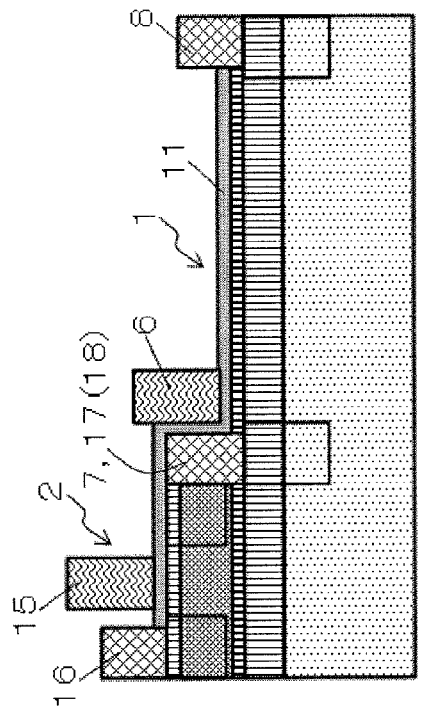
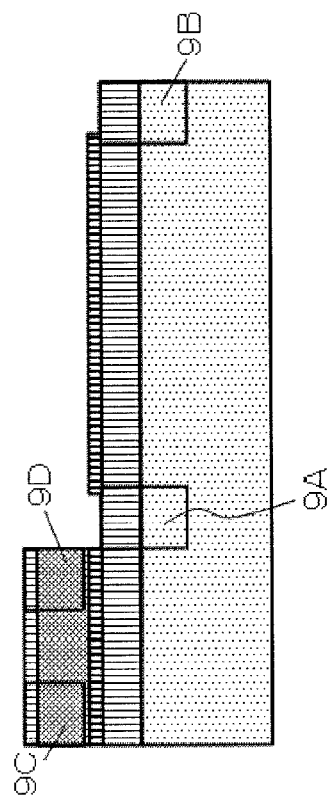

SEMICONDUCTOR DEVICE, METHOD FOR MANUFACTURING THE SAME, POWER SUPPLY, AND HIGH-FREQUENCY AMPLIFIER

CROSS-REFERENCE TO RELATED APPLICATION

This application is based upon and claims the benefit of priority of the prior Japanese Patent Application No. 2012-279707, filed on Dec. 21, 2012, the entire contents of which are incorporated herein by reference.

FIELD

The embodiments discussed herein are related to a semiconductor device, a method for manufacturing the semiconductor device, a power supply, and a high-frequency amplifier.

BACKGROUND

Nitride semiconductor devices have characteristics such as exhibiting high saturated electron velocity and a wide band gap. Such characteristics have been utilized to advance development of devices having a high withstand voltage and high power. Examples of the nitride semiconductor devices used for development of such devices having a high withstand voltage and high power include field-effect transistors, in particular, high electron mobility transistors (HEMTs).

An example of HEMTs is a GaN-HEMT (AlGaN/GaN-HEMT) having an HEMT structure in which an AlGaN electron supply layer is disposed on a GaN electron transit layer. In the GaN-HEMT, strain is generated in AlGaN owing to difference in a lattice constant between AlGaN and GaN, and the strain causes piezoelectric polarization. This piezoelectric polarization and the spontaneous polarization of the AlGaN cause high-concentration two dimensional electron gas (2DEG) to be generated. Hence, the GaN-HEMT enables development of devices having a high withstand voltage and high power.

In the GaN-HEMT, however, high-concentration 2DEG makes operation in a normally-off mode difficult. In a technique for enabling operation in a normally-off mode, for example, part of an electron supply layer right below a gate electrode is etched to interrupt the flow of 2DEG. This technique is herein referred to as a first technique. Furthermore, in another technique for enabling operation in a normally-off mode, for instance, a p-type GaN layer is formed right below a gate electrode to counteract 2DEG. This technique is herein referred to as a second technique. Such a structure is also referred to as a p-GaN gate structure. Furthermore, for example, in a technique for enabling operation in a normally-off mode as well as enabling both a low source resistance and operation at a high operating voltage, a 2DEG-reducing layer doped with a p-type dopant and a low-resistance layer doped with an n-type dopant are formed so as to overlie part of an electron supply layer between a source electrode and a gate electrode. This technique is herein referred to as a third technique. Moreover, for example, in a technique for enabling operation in a normally-off mode as well as enabling both a low on-resistance and a high withstand voltage, part of an electron transit layer underlying a source electrode and a gate electrode is doped with a p-type dopant. This technique is herein referred to as a fourth technique.

In the first technique, however, the etching damages part of a normally-off transistor below the gate electrode, which causes increases in on-resistance and a leak current. Hence, the first technique is impractical for enabling steady operation in a normally-off mode with a low on-resistance. In the second technique, the counteraction of 2DEG by the p-type GaN layer for operation in a normally-off mode entails a reduction in the thickness of the electron supply layer; however, in this case, it is difficult to enable a low on-resistance and a high withstand voltage. In particular, in the case where the thickness of the electron supply layer is reduced for enabling operation in a normally-off mode, the distance between the gate electrode and the drain electrode is increased to achieve a high withstand voltage; however, the increase in the distance therebetween results in an increase in on-resistance. Thus, the second technique is unsuitable for enabling operation in a normally-off mode as well as enabling a low on-resistance and a high withstand voltage.

In the third technique, since the p-type dopant added to the 2DEG-reducing layer is diffused to the electron supply layer or the electron transit layer during the crystal growth thereof. Thus, the third technique is impractical for enabling operation in a normally-off mode as well as enabling a low on-resistance and a high withstand voltage. In the third technique, for instance, even though the thickness of the electron supply layer and the distance between the gate electrode and the drain electrode are increased to achieve a high withstand voltage as well as a low on-resistance, such an approach does not work well to keep the on-resistance in a low level. In addition, since the third technique involves a structure in which the 2DEG-reducing layer and the low-resistance layer are merely laminated, the electron mobility is low, and the channel resistance is high; hence, the on-resistance is not successfully reduced.

In the fourth technique, the p-type dopant added to part of the electron transit layer is diffused to the other part of the electron transit layer during the crystal growth thereof. Thus, the fourth technique is impractical for enabling operation in a normally-off mode as well as enabling a low on-resistance and a high withstand voltage. In the fourth technique, for example, even though the thickness of the electron supply layer and the distance between the gate electrode and the drain electrode are increased to achieve a high withstand voltage as well as a low on-resistance, such an approach does not work well to keep the on-resistance in a low level.

The followings are reference documents:
[Document 1] Japanese Laid-open Patent Publication No. 2009-76845,
[Document 2] Japanese Laid-open Patent Publication No. 2007-19309,
[Document 3] International Publication Pamphlet No. WO 2010/016564, and
[Document 4] Japanese Laid-open Patent Publication No. 2004-260140.

SUMMARY

According to an aspect of the invention, a semiconductor device includes: a first transistor that includes a first gate electrode, a first source electrode, a first drain electrode, and a first nitride semiconductor laminate that includes a first electron transit layer and a first electron supply layer; a second transistor that includes a second gate electrode, a second source electrode, a second drain electrode, and a second nitride semiconductor laminate that includes a second electron transit layer and a second electron supply layer, the second drain electrode being a common electrode that also serves as the first source electrode, the second electron transit layer having part that underlies the second gate electrode and that contains a p-type dopant; and a p-type-dopant-diffusion-blocking layer, wherein the second nitride semiconductor laminate is disposed higher than the first nitride semiconductor laminate with the p-type-dopant-diffusion-blocking layer interposed between the first and second nitride semiconductor laminates, and the first gate electrode and the second source electrode are electrically coupled to each other to establish cascode connection of the first transistor to the second transistor.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 2A to 2D are schematic cross-sectional views illustrating a method for manufacturing the semiconductor device according to the first embodiment;

DESCRIPTION OF EMBODIMENTS

A semiconductor device, a method for manufacturing the semiconductor device, a power supply, and a high-frequency amplifier according to embodiments will hereinafter be described with reference to the drawings.

First Embodiment

A semiconductor device and a method for manufacturing the semiconductor device according to a first embodiment will now be described with reference to FIGS. 1 to 4B.

Figure 1:
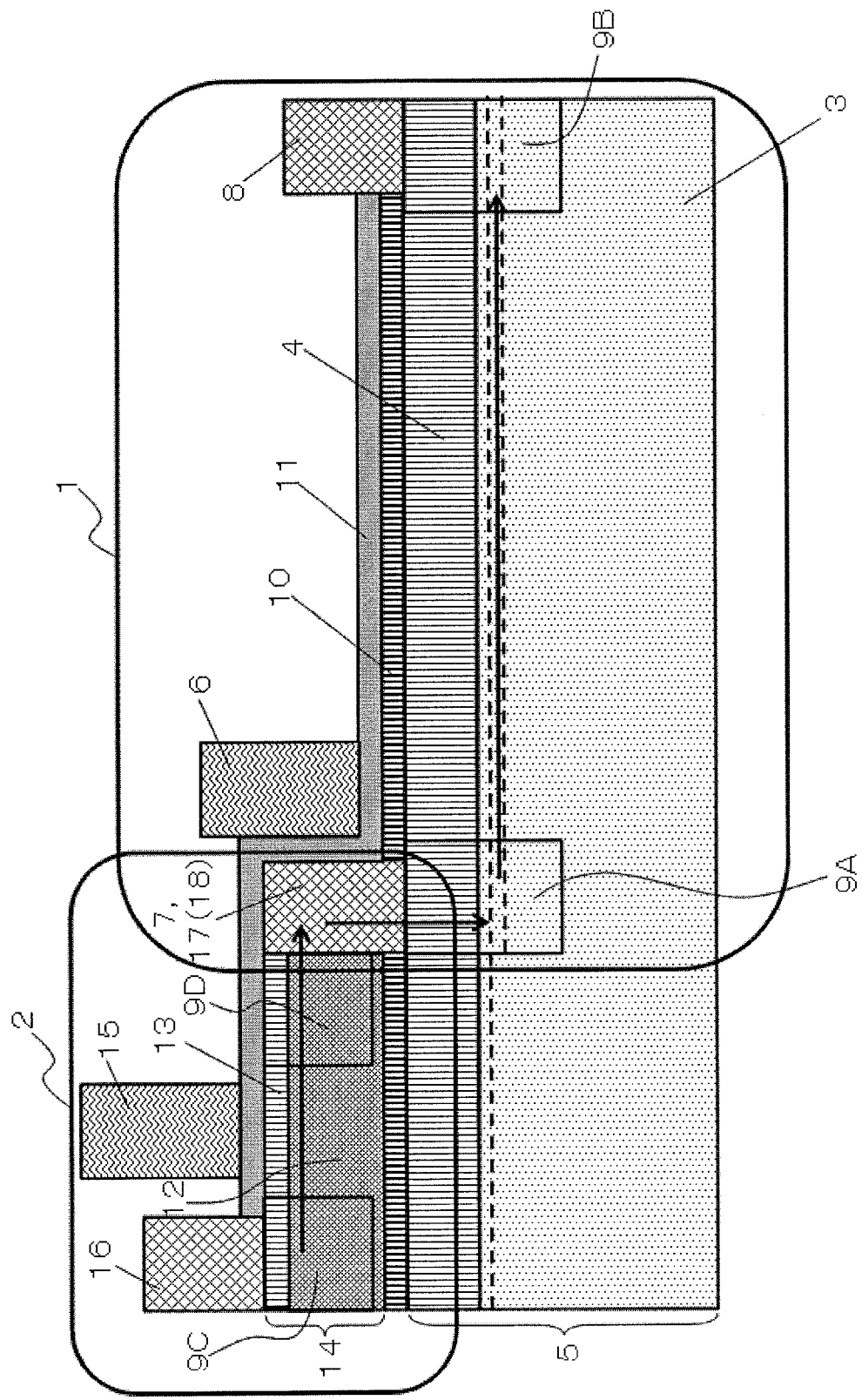
FIG. 1 is a schematic cross-sectional view illustrating the configuration of a semiconductor device according to a first embodiment.

The semiconductor device of the first embodiment is a compound semiconductor device, particularly, a device in which a nitride semiconductor material is used and which has a high withstand voltage and high power. Such a semiconductor device is also referred to as a nitride semiconductor device. The semiconductor device of the first embodiment includes a field effect transistor in which a nitride semiconductor material is used. Such a field effect transistor is also referred to as a nitride semiconductor field effect transistor. In particular, the semiconductor device of the first embodiment is a GaN device in which a GaN semiconductor material is used; with reference to FIG. 1, the semiconductor device includes a GaN-HEMT 1 that is a normally-on transistor and a GaN-HEMT 2 that is a normally-off transistor. In FIG. 1, a dotted line represents 2DEG, and arrows represent current paths.

The GaN-HEMT that is a normally-on transistor is also referred to as a normally-on HEMT, a normally-on HEMT region, or a first transistor. The GaN-HEMT that is a normally-off transistor is also referred to as a normally-off HEMT, a normally-off HEMT region, or a second transistor. In the semiconductor device of the first embodiment, the normally-on HEMT 1 and the normally-off HEMT 2 are disposed so as to overlie the same semiconductor substrate, the normally-off HEMT 2 is positioned higher than the normally-on HEMT 1, and the normally-on HEMT 1 and the normally-off HEMT 2 are cascode-connected to each other.

The normally-on HEMT 1 includes a first nitride semiconductor laminate 5, a gate electrode 6, a source electrode 7, and a drain electrode 8, the first nitride semiconductor laminate 5 including an i-GaN electron transit layer 3 and n-AlGaN electron supply layer 4 formed so as to overlie a semiconductor substrate (not illustrated). In the first embodiment, part of the n-AlGaN electron supply layer 4 and part of the i-GaN electron transit layer 3 immediately underlying the source electrode 7 are doped with an n-type dopant, and these n-doped parts serve as an n-type contact region 9A. The source electrode 7 is formed on the n-type contact region 9A (in the first embodiment, on the n-type contact region of the n-AlGaN electron supply layer 4). Similarly, another part of the n-AlGaN electron supply layer 4 and another part of the i-GaN electron transit layer 3 immediately underlying the drain electrode 8 are doped with an n-type dopant, and these n-doped parts serve as an n-type contact region 9B. The drain electrode 8 is formed on the n-type contact region 9B (in the first embodiment, on the n-type contact region of the n-AlGaN electron supply layer 4). The n-type contact regions 9A and 9B may be formed by, for example, ion implantation of an n-type dopant such as Si. In this case, the n-type contact regions 9A and 9B are regions into which ions of an n-type dopant have been implanted. An AlN impurity-diffusion-blocking layer 10 is disposed on the first nitride semiconductor laminate 5, and the surface of the AlN impurity-diffusion-blocking layer 10 is covered with, for instance, an SiN film 11 (passivation film, gate insulator, or insulating film). The gate electrode 6 is disposed on the SiN film 11. Such a structure is a metal insulator semiconductor (MIS) structure and may be a Schottky structure in which part of the SiN film 11 right under the gate electrode 6 has been removed. Although the n-type contact regions 9A and 9B are disposed right under the source electrode 7 and the drain electrode 8 in the first embodiment, respectively, forming of the n-type contact regions 9A and 9B may be omitted. In addition, the source electrode 7 and the drain electrode 8 may be formed after removal of parts of the n-AlGaN electron supply layer 4 right under the positions at which the source electrode 7 and the drain electrode 8 are to be formed.

The first nitride semiconductor laminate 5 is also referred to as a compound semiconductor laminate, a GaN-HEMT structure, an AlGaN/GaN-HEMT structure, or a GaN-HEMT crystal. The first nitride semiconductor laminate 5 may include at least an electron transit layer and an electron supply layer and may include other semiconductor layers. The first nitride semiconductor laminate 5 may be, for example, a nitride semiconductor laminate which enables formation of field effect transistors such as a field effect transistor in which a nitride semiconductor is used. The i-GaN electron transit layer 3 is also referred to as a first electron transit layer. The n-AlGaN electron supply layer 4 is also referred to as a first electron supply layer. The gate electrode 6 is also referred to as a first gate electrode. The source electrode 7 is also referred to as a first source electrode. The drain electrode 8 is also referred to as a first drain electrode.

In the semiconductor device of the first embodiment, the AlN impurity-diffusion-blocking layer 10 is disposed on the first nitride semiconductor laminate 5. The AlN impurity-diffusion-blocking layer 10 serves to block diffusion of a p-type dopant from a p-GaN electron transit layer 12 formed thereon to the n-AlGaN electron supply layer 4 and the i-GaN electron transit layer 3 during the crystal growth thereof. The AlN impurity-diffusion-blocking layer 10 is therefore also referred to as a p-type-dopant-diffusion-blocking layer.

The p-type-dopant-diffusion-blocking layer 10 is the AlN layer in the first embodiment but is not limited thereto; for example, the p-type-dopant-diffusion-blocking layer 10 may be an AlGaN layer. In other words, the p-type-dopant-diffusion-blocking layer 10 may be any layer provided that the layer contains AlGaN or AlN. The p-type-dopant-diffusion-blocking layer 10 preferably contains AlGaN or AlN having an Al content of at least 0.5. In particular, the Al content (Al content rate) is preferably larger in the p-type-dopant-diffusion-blocking layer 10 than in the n-AlGaN electron supply layer 4 formed under the p-type-dopant-diffusion-blocking layer 10. In the first embodiment, for example, the Al content of the n-AlGaN electron supply layer 4 formed under the p-type-dopant-diffusion-blocking layer 10 is 0.3; since the p-type-dopant-diffusion-blocking layer 10 is the AlN layer, the Al content is larger in the p-type-dopant-diffusion-blocking layer 10 than in the n-AlGaN electron supply layer 4 formed under the p-type-dopant-diffusion-blocking layer 10. Hence, this structure enables diffusion of a p-type dopant to be further effectively blocked. Furthermore, the p-type-dopant-diffusion-blocking layer 10 having a larger Al content than the n-AlGaN electron supply layer 4 exhibits the large degrees of spontaneous polarization and piezoelectric polarization, which also gives an effect of an increase in the amount of 2DEG generated in the normally-on HEMT 1. In this case, the amount of the 2DEG may be increased in proportion to an increase in the Al content in the p-type-dopant-diffusion-blocking layer 10.

The normally-off HEMT 2 is disposed so as to overlie part of the AlN impurity-diffusion-blocking layer 10. The normally-off HEMT 2 includes a second nitride semiconductor laminate 14 having a layered structure of the p-GaN electron transit layer 12 and an n-AlGaN electron supply layer 13. The second nitride semiconductor laminate 14 is positioned higher than the first nitride semiconductor laminate 5 included in the normally-on HEMT 1 with the AlN impurity-diffusion-blocking layer 10 interposed therebetween.

A gate electrode 15 and a source electrode 16 are disposed so as to overlie the second nitride semiconductor laminate 14, and a drain electrode 17 is disposed on the side of the second nitride semiconductor laminate 14. The drain electrode 17 is a common electrode 18 that also serves as the source electrode 7 of the normally-on HEMT 1. In this case, the source electrode 7 of the normally-on HEMT 1 and the drain electrode 17 of the normally-off HEMT 2, which are the common electrode 18, are formed of the same metal as used for forming the drain electrode 8 of the normally-on HEMT 1 and the source electrode 16 of the normally-off HEMT 2.

In the first embodiment, part of the n-AlGaN electron supply layer 13 and part of the p-GaN electron transit layer 12 immediately underlying the source electrode 16 are doped with an n-type dopant, and these n-doped parts serve as an n-type contact region 9C. The source electrode 16 is formed on the n-type contact region 9C (in the first embodiment, on the n-type contact region of the n-AlGaN electron supply layer 13). Parts of the n-AlGaN electron supply layer 13 and p-GaN electron transit layer 12 which are in contact with the drain electrode 17 are doped with an n-type dopant, and these n-doped parts serve as an n-type contact region 9D. The drain electrode 17 is formed so as to be in contact with the n-type contact region 9D. The n-type contact regions 9C and 9D may be formed by, for example, ion implantation of an n-type dopant such as Si. In this case, the n-type contact regions 9C and 9D are regions into which ions of an n-type dopant have been implanted. The surface of the second nitride semiconductor laminate 14, namely, the surface of the n-AlGaN electron supply layer 13 included in the second nitride semiconductor laminate 14 is covered with, for instance, the SiN film 11 (passivation film, gate insulator, or insulating film). The gate electrode 15 is disposed on the SiN film 11. Such a structure is an MIS structure and may be a Schottky structure in which part of the SiN film 11 right under the gate electrode 15 has been removed.

In such a structure, part of the p-GaN electron transit layer 12 on the source electrode 16 side is an n type, another part thereof right below the gate electrode 15 is a p type, and another part thereof on the drain electrode 17 side is an n type; hence, the normally-off HEMT 2 has an npn structure. Both the n-type contact regions 9C and 9D preferably extend to a region immediately below the gate electrode 15. The electron transit layer 12 of the normally-off HEMT 2 may have part containing a p-type dopant right below the gate electrode 15 in this manner.

The second nitride semiconductor laminate 14 is also referred to as a compound semiconductor laminate, a GaN-HEMT structure, an AlGaN/GaN-HEMT structure, or a GaN-HEMT crystal. The second nitride semiconductor laminate 14 may include at least an electron transit layer and an electron supply layer and may include other semiconductor layers. The second nitride semiconductor laminate 14 may be, for example, a nitride semiconductor laminate which enables formation of field effect transistors such as a field effect transistor in which a nitride semiconductor is used. The p-GaN electron transit layer 12 is also referred to as a second electron transit layer. The n-AlGaN electron supply layer 13 is also referred to as a second electron supply layer. The gate electrode 15 is also referred to as a second gate electrode. The source electrode 16 is also referred to as a second source electrode. The drain electrode 17 is also referred to as a second drain electrode.

In the first embodiment, particularly, use of the p-GaN layer as the electron transit layer 12 enables operation in a normally-off mode. In particular, use of the p-GaN layer as the electron transit layer 12 leads to elevation of an energy band immediately below the gate electrode 15. The elevation of an energy band makes the energy level of a conductive band at the interface between the p-GaN electron transit layer 12 and the n-AlGaN electron supply layer 13 higher than Fermi level with the result that generation of 2DEG is suppressed, thereby enabling operation in a normally-off mode. In this case, as compared with traditional p-GaN gate structures in which a p-GaN layer is provided between a gate electrode and an electron supply layer, the p-GaN electron transit layer 12 is positioned closer to the channel region (region in which electrons move), and the first embodiment therefore further easily enables operation in a normally-off mode. In addition, since the magnitude of the threshold voltage of the normally-off HEMT 2 is in proportion to the concentration of a p-type dopant which is added to the p-GaN electron transit layer 12, the threshold voltage is controllable on the basis of the concentration of the p-type dopant which is added to the p-GaN electron transit layer 12. Thus, the first embodiment enables easy control of the threshold voltage as compared with traditional p-GaN gate structures.

In the first embodiment, since the transistor that serves for operation in a normally-off mode includes the electron transit layer 12 containing a p-type dopant while the transistor has an HEMT structure including the electron transit layer 12 and the electron supply layer 13, the electron mobility is high, which enables a normally-off transistor which operates faster and which has higher performance as compared with common metal oxide semiconductor field effect transistors (MOSFETs). In the first embodiment, the p-GaN electron transit layer 12 is doped with Mg that is a p-type dopant. The p-type dopant which is to be added to the p-GaN electron transit layer 12 is not limited to Mg; for instance, Be, Fe, and C may be used. In particular, the p-GaN electron transit layer 12 may contain GaN and any p-type dopant selected from Be, Mg, Fe, and C. In the first embodiment, AlGaN is used for the electron supply layer 13, but the material of the electron supply layer 13 is not limited to AlGaN; for example, the electron supply layer 13 may contain any of AlGaN, InAlN, and AlInGaN.

In the first embodiment, for example, in addition to the surface of the AlN impurity-diffusion-blocking layer 10 formed on the first nitride semiconductor laminate 5 of the normally-on HEMT 1 and the surface of the second nitride semiconductor laminate 14 of the normally-off HEMT 2, the surface of the common electrode 18, which serves as the source electrode 7 of the normally-on HEMT 1 and the drain electrode 17 of the normally-off HEMT 2, is also covered with, for instance, the SiN film 11 (passivation film, gate insulator, or insulating film).

In the first embodiment, the drain electrode 8 of the normally-on HEMT 1 and the gate electrode 15 and source electrode 16 of the normally-off HEMT 2 are connected to, for example, wires and pads. The gate electrode 6 of the normally-on HEMT 1 is electrically connected to the source electrode 16 of the normally-off HEMT 2 to establish the cascode connection of the normally-on HEMT 1 to the normally-off HEMT 2. In this case, the source electrode 16 of the normally-off HEMT 2 is grounded, and the gate electrode 6 of the normally-on HEMT 1 is electrically connected thereto. In other words, the common-source normally-off HEMT 2 is connected to the common-gate normally-on HEMT 1 in series to establish the cascode connection of the normally-on HEMT 1 to the normally-off HEMT 2.

In the semiconductor device of the first embodiment having such a structure, since the electron transit layer 12 of the normally-off HEMT 2, which has been doped with a p-type dopant, is disposed above the electron supply layer 4 and electron transit layer 3 of the normally-on HEMT 1 with the p-type-dopant-diffusion-blocking layer 10 interposed therebetween, the diffusion of the p-type dopant contained in the electron transit layer 12 of the normally-off HEMT 2 to the electron supply layer 4 and electron transit layer 3 of the normally-on HEMT 1 may be blocked during the crystal growth thereof. As described above, use of the p-type-dopant-diffusion-blocking layer 10 having a larger Al content than the n-AlGaN electron supply layer 4 leads to an increase in the amount of 2DEG generated in the normally-on HEMT 1.

Thus, operation in a normally-off mode is enabled while a low on-resistance and a high withstand voltage are enabled.

The normally-off HEMT 2 includes the electron transit layer 12 that is the p-GaN layer containing a p-type dopant while the normally-off HEMT 2 has the HEMT structure including the electron transit layer 12 and the electron supply layer 13. Hence, the electron mobility is high, and the channel resistance is low, which enables a low on-resistance. Thus, operation in a normally-off mode is enabled while a high withstand voltage is enabled.

The normally-off HEMT 2 is not damaged by etching as described below. Increases in on-resistance and a leak current due to damage by etching therefore do not occur. Hence, operation in a normally-off mode is steadily enabled as well as a low in on-resistance. In the normally-off HEMT 2, the electron transit layer 12 is a p-GaN layer. In this case, since the magnitude of the threshold voltage of the normally-off HEMT 2 is in proportion to the concentration of a p-type dopant which is added to the p-GaN electron transit layer 12, the threshold voltage is controllable on the basis of the concentration of the p-type dopant which is added to the p-GaN electron transit layer 12. Thus, the first embodiment enables easy control of the threshold voltage. As compared with, for instance, traditional p-GaN gate structures, easy control of the threshold voltage and operation in a normally-off mode are readily enabled.

The structure in which the normally-on HEMT 1 and normally-off HEMT 2 formed so as to overlie the same semiconductor substrate are cascode-connected to each other (monolithic cascode connection) enables a reduction in the length of interconnection as compared with, for example, the structure in which an Si-MOSFET and GaN-HEMT formed so as to overlie different semiconductor substrates are cascode-connected to each other (hybrid cascade connection); hence, the reactance of the circuit may be reduced, which leads to an enhancement in the speed of the operation of the circuit.

In the semiconductor device of the first embodiment having the structure described above, since operation in a normally-off mode is enabled by the normally-off HEMT 2 alone, the normally-on HEMT 1 may be independently configured regardless of the operation in a normally-off mode. In particular, since the normally-on HEMT 1 may be configured so as not to contribute to operation in a normally-off mode, the amount of 2DEG, namely, the thickness of the electron supply layer 4 may be independently determined to reduce on-resistance. Thus, in the normally-on HEMT 1, the thickness of the electron supply layer 4 may be increased to increase the amount of 2DEG, thereby decreasing the on-resistance. In other words, the electron supply layer 4 of the normally-on HEMT 1 preferably has a large thickness to reduce on-resistance. It is preferred, for example, that the thickness of the electron supply layer 4 of the normally-on HEMT 1 be larger than that of the electron supply layer 13 of the normally-off HEMT 2. In the case where the electron supply layer 4 of the normally-on HEMT 1 is configured so as to have a large thickness, the n-type contact regions 9A and 9B are preferably formed right under the source electrode 7 and the drain electrode 8, respectively, to reduce the resistance generated due to the electron supply layer 4. However, since an increase in the thickness of the electron supply layer 4 causes the amount of 2DEG to be increased, forming of the n-type contact regions 9A and 9B may be omitted. In the normally-on HEMT 1, an increase in the distance between the gate electrode 6 and the drain electrode 8 enables an increase in a withstand voltage. In other words, in the normally-on HEMT 1, the distance between the gate electrode 6 and the drain electrode 8 is preferably increased to increase a withstand voltage. In the normally-on HEMT 1, for instance, the gate electrode 6, the drain electrode 8, and the source electrode 7 are preferably formed such that the distance between the gate electrode 6 and the drain electrode 8 is larger than the distance between the gate electrode 6 and the source electrode 7.

In the normally-on HEMT 1, in the case where the distance between the gate electrode 6 and the drain electrode 8 is increased to increase the withstand voltage, the thickness of the electron supply layer 4 is increased to suppress an increase in the on-resistance brought about by such an increased distance. In other words, a withstand voltage may be increased while a low on-resistance is enabled. Hence, the normally-on HEMT 1 is also referred to as a functional region for high withstand voltage.

As described above, the normally-on HEMT 1 that is the functional region for high withstand voltage is combined with the normally-off HEMT 2 that is the functional region for operation in a normally-off mode, which enables the operation in the normally-off as well as both a low on-resistance and a high withstand voltage. In particular, the functional region for operation in a normally-off mode and the functional region for high withstand voltage are separated and cascode-connected to each other, which enables production of a device which operates in a normally-off mode while both a low on-resistance and a high withstand are enabled.

In particular, the diffusion of the p-type dopant contained in the electron transit layer 12 of the normally-off HEMT 2 to the electron supply layer 4 and electron transit layer 3 of the normally-on HEMT 1 may be blocked during the crystal growth thereof as described above, which enables the on-resistance of the normally-on HEMT 1 to be kept in a low level. A method for manufacturing the semiconductor device of the first embodiment will now be described with reference to FIGS. 2A to 4B.

As illustrated in FIG. 2A, an i-GaN layer 3 that serves as the first electron transit layer, an n-AlGaN layer 4 that serves as the first electron supply layer, an AlN layer 10 that serves as a p-type-dopant-diffusion-blocking layer, a p-GaN layer 12 that serves as the second electron transit layer, and an n-AlGaN layer 13 that serves as the second electron supply layer are formed so as to overlie a semiconductor substrate (not illustrated). In this case, the semiconductor substrate may be, for example, semi-insulating SiC substrate 20 (see FIG. 3A). Furthermore, for instance, a nucleation layer 21 and a buffer layer 22 may be formed between the semiconductor substrate 20 and the i-GaN layer 3 that serves as the first electron transit layer (see FIG. 3A). The thickness of the i-GaN layer 3 that serves as the first electron transit layer may be, for example, approximately 3 μm. Furthermore, an i-AlGaN layer 23 that serves as a first spacer layer may be formed between the i-GaN layer 3 that serves as the first electron transit layer and the n-AlGaN layer 4 that serves as the first electron supply layer (see FIG. 3A). In this case, the thickness of the i-AlGaN layer 23 that serves as the first spacer layer may be, for instance, approximately 5 nm. In the n-AlGaN layer 4 that serves as the first electron supply layer, for instance, the thickness thereof may be approximately 30 nm, the Al content may be 0.3, in particular, in the formula of $Al_xGa_{1-x}N$, x is 0.3, the n-type dopant to be added thereto may be Si, and the dopant concentration may be approximately $5\times10^{18}$ cm$^{-3}$. The AlN layer 10 (in the formula of $Al_xGa_{1-x}N$, x is 1) that serves as the p-type-dopant-diffusion-blocking layer may have a thickness of, for example, approximately 5 nm. In the p-GaN layer 12 that serves as the second electron transit layer, for instance, the thickness thereof may be approximately 100 nm, the p-type dopant added thereto may be Mg, and the dopant concentration may be approximately $1\times10^{21}$ cm$^{-3}$. Moreover, an i-AlGaN layer 24 that serves as a second spacer layer may be formed between the p-GaN layer 12 that serves as the second electron transit layer and the n-AlGaN layer 13 that serves as the second electron supply layer (see FIG. 3A). In this case, the thickness of the i-AlGaN layer 24 that serves as the second spacer layer may be, for instance, approximately 5 nm. In the n-AlGaN layer 13 that serves as the second electron supply layer, for example, the thickness thereof may be approximately 30 nm, the n-type dopant to be added thereto may be Si, and the dopant concentration may be approximately $5\times10^{18}$ cm$^{-3}$. An example of a crystal growth method is metal organic vapor phase epitaxy (MOVPE). The source gas used for forming each nitride semiconductor layer may be a mixed gas of trimethylaluminum (TMA), trimethylgallium (TMG), and ammonia (NH$_3$), and the supply and flow rate of TMA as an Al source or TMG as a Ga source may be appropriately adjusted depending on the type of nitride semiconductor layers to be formed.

Figure 3A:
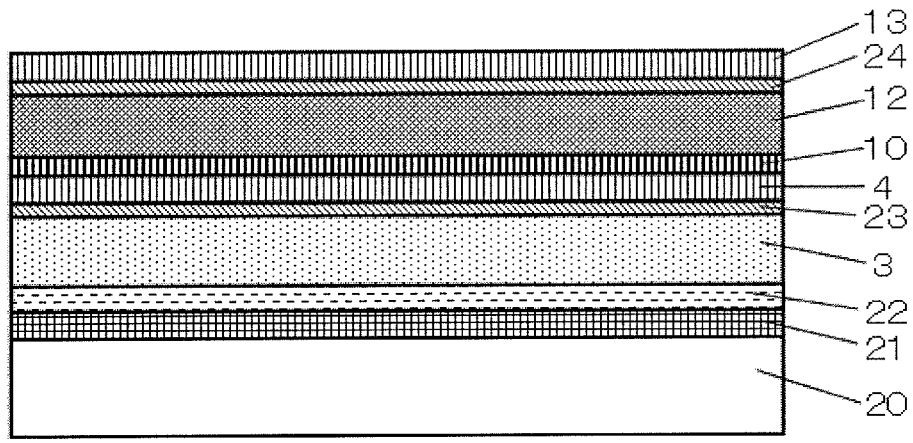
FIGS. 3A to 3C are schematic cross-sectional views illustrating a method for manufacturing a semiconductor device according to a modification of the first embodiment.

The semi-insulating SiC substrate 20 is prepared as a semiconductor substrate, and the nucleation layer 21, the buffer layer 22, the i-GaN layer 3 that serves as the first electron transit layer, the i-AlGaN layer 23 that serves as the first spacer layer, the n-AlGaN layer 4 that serves as the first electron supply layer, the AlN layer 10 that serves as the p-type-dopant-diffusion-blocking layer, the p-GaN layer 12 that serves as the second electron transit layer, the i-AlGaN layer 24 that serves as the second spacer layer, and the n-AlGaN layer 13 that serves as the second electron supply layer are formed so as to overlie the semiconductor substrate, thereby forming the structure illustrated in FIG. 3A.

The p-type dopant (for example, Mg) contained in the p-GaN layer 12 that serves as the second electron transit layer is highly diffusive during the crystal growth thereof. The AlN layer 10 that serves as the p-type-dopant-diffusion-blocking layer is, however, disposed under the p-GaN layer 12 that serves as the second electron transit layer, and the n-AlGaN layer 4 that serves as the first electron supply layer and the i-GaN layer 3 that serves as the first electron transit layer underlie the AlN layer 10, which serves as the p-type-dopant-diffusion-blocking layer, so as to be covered therewith. Hence, during the crystal growth for forming the p-GaN layer 12 that serves as the second electron transit layer, the p-type dopant (for instance, Mg) contained in the p-GaN layer 12 that serves as the second electron transit layer may be inhibited from diffusing to the n-AlGaN layer 4 that serves as the first electron supply layer and the i-GaN layer 3 that serves as the first electron transit layer, the n-AlGaN layer 4 and the i-GaN layer 3 underlying the p-GaN layer 12. Such a structure may preclude the impaired performance of the device, such as an increase in on-resistance. In addition, the AlN layer 10 that serves as the p-type-dopant-diffusion-blocking layer also enables an increase in the amount of the 2DEG generated in the normally-on HEMT 1.

In the first embodiment, although the AlN layer is formed as the p-type-dopant-diffusion-blocking layer 10, the p-type-dopant-diffusion-blocking layer 10 is not limited thereto; for example, the p-type-dopant-diffusion-blocking layer 10 may be an AlGaN layer. In other words, the p-type-dopant-diffusion-blocking layer 10 may be formed of AlGaN or AlN. In particular, the p-type-dopant-diffusion-blocking layer 10 is preferably formed of AlGaN or AlN having an Al content of not less than 0.5. In the first embodiment, the second electron transit layer 12 is a p-GaN layer doped with Mg that is a p-type dopant but is not limited thereto; the second electron transit layer 12 may be a p-GaN layer doped with another p-type dopant such as Be, Fe, or C. In other words, the p-GaN layer 12 that is the second electron transit layer may be a layer containing GaN and any of p-type dopants selected from as Be, Mg, Fe, and C. In the first embodiment, the second electron supply layer is the AlGaN layer 13 but not limited thereto; a layer containing any of AlGaN, InAlN, and AlInGaN may be formed. The first electron supply layer 4 preferably has a large thickness. The first electron supply layer 4 is preferably formed, for instance, so as to have a thickness larger than that of the second electron supply layer 13. This structure enables the amount of 2DEG to be increased, leading to a reduction in the on-resistance. The gate electrode 6 and the drain electrode 8 are preferably disposed so as to be spaced apart from each other at a large distance. This structure enables a high withstand voltage. The gate electrode 6, the drain electrode 8, and the source electrode 7 are preferably formed, for instance, such that the distance between the gate electrode 6 and the drain electrode 8 is larger than the distance between the gate electrode 6 and the source electrode 7.

Then, as illustrated in FIG. 2B, parts of the n-AlGaN layer 13 and p-GaN layer 12 corresponding to a region other than a region in which a normally-off HEMT is to be formed, in other words, corresponding to a region in which a normally-on HEMT is to be formed (right side in FIG. 2B) are removed through, for example, etching by photolithography. In this process, the AlN layer 10 that is to be the p-type-dopant-diffusion-blocking layer serves as an etch stop layer. Hence, the n-AlGaN layer 4 that serves as the first electron supply layer and the i-GaN layer 3 that serves as the first electron transit layer, namely, a channel region (access region) is protected from damage due to the etching, the n-AlGaN layer 4 and the i-GaN layer 3 being included in the normally-on HEMT 1. Furthermore, parts of the AlN layer 10 that serves as the p-type-dopant-diffusion-blocking layer are removed through, for instance, etching by photolithography, these parts corresponding to regions in which the source electrode and drain electrode of the normally-on HEMT 1 are to be formed.

Through this process, a nitride semiconductor laminate having a layered structure of the i-GaN electron transit layer 3 (first electron transit layer) and the n-AlGaN electron supply layer 4 (first electron supply layer) has been formed as the first nitride semiconductor laminate 5 included in the normally-on HEMT 1. A nitride semiconductor laminate having a layered structure of the p-GaN electron transit layer 12 (second electron transit layer) and the n-AlGaN electron supply layer 13 (second electron supply layer) is formed as the second nitride semiconductor laminate 14 included in the normally-off HEMT 2 so as to be positioned higher than the first nitride semiconductor laminate 5 included in the normally-on HEMT 1 with the AlN impurity-diffusion-blocking layer 10 as the p-type-dopant-diffusion-blocking layer interposed therebetween.

Figure 3B:
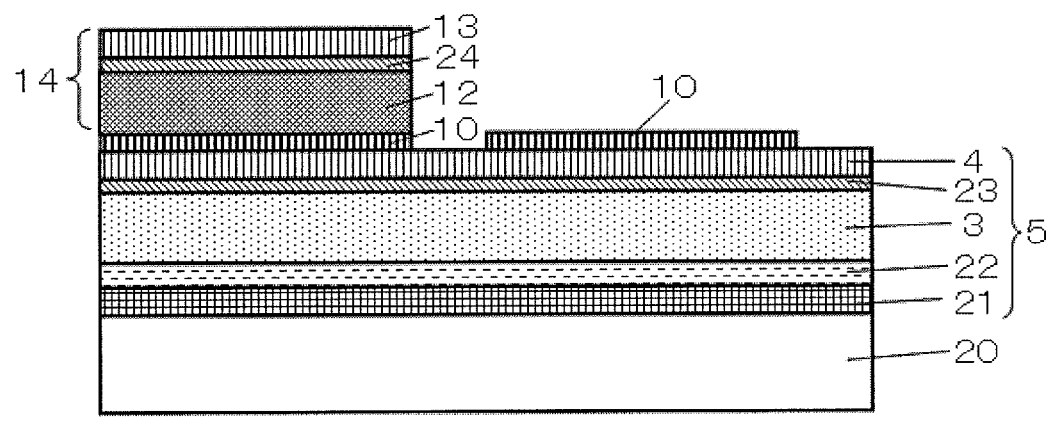

In the case where the semi-insulating SiC substrate 20 is prepared as a semiconductor substrate and where the nucleation layer 21, the buffer layer 22, the i-GaN layer 3 that serves as the first electron transit layer, the i-AlGaN layer 23 that serves as the first spacer layer, the n-AlGaN layer 4 that serves as the first electron supply layer, the AlN layer 10 that serves as the p-type-dopant-diffusion-blocking layer, the p-GaN layer 12 that serves as the second electron transit layer, the i-AlGaN layer 24 that serves as the second spacer layer, and the n-AlGaN layer 13 that serves as the second electron supply layer are formed so as to overlie the semiconductor substrate, parts of the n-AlGaN layer 13, i-AlGaN layer 24, and p-GaN layer 12, which correspond to a region other than a region in which the normally-off HEMT is to be formed, are removed by etching, and parts of the AlN layer 10, which is a p-type-dopant-diffusion-blocking layer, corresponding to parts at which a source electrode and a drain electrode are to be formed in a region in which the normally-on HEMT is to be formed are removed by etching, thereby providing the structure illustrated in FIG. 3B.

In this case, a nitride semiconductor laminate having a layered structure of the nucleation layer 21, the buffer layer 22, the i-GaN electron transit layer 3 (first electron transit layer), the i-AlGaN first spacer layer 23, and the n-AlGaN electron supply layer 4 (first electron supply layer) is formed as the first nitride semiconductor laminate 5 included in the normally-on HEMT 1. In addition, a nitride semiconductor laminate having a layered structure of the p-GaN electron transit layer 12 (second electron transit layer), the i-AlGaN second spacer layer 24, and the n-AlGaN electron supply layer 13 (second electron supply layer) is formed as the second nitride semiconductor laminate 14 included in the normally-off HEMT 2 so as to be positioned higher than the first nitride semiconductor laminate 5 included in the normally-on HEMT 1 with the AlN impurity-diffusion-blocking layer 10 as the p-type-dopant-diffusion-blocking layer interposed therebetween.

Then, as illustrated in FIG. 2C, ions of an n-type dopant such as Si are implanted into a region which the drain electrode 8 of the normally-on HEMT 1 is to contact, a region to which the source electrode 16 of the normally-off HEMT 2 is to contact, and regions which the common electrode 18 that serves as the source electrode 7 of the normally-on HEMT 1 and the drain electrode 17 of the normally-off HEMT 2 is to contact, and then the product is subjected to an activation treatment such as a heat treatment, thereby forming n-type contact regions 9A to 9D that are n-doped regions.

In this process, ions of an n-type dopant such as Si are implanted into parts of the n-AlGaN electron supply layer 4 and i-GaN electron transit layer 3 which are to underlie the drain electrode 8 of the normally-on HEMT 1. In addition, ions of an n-type dopant such as Si are implanted into parts of the n-AlGaN electron supply layer 13 and p-GaN electron transit layer 12 which are to underlie the source electrode 16 of the normally-off HEMT 2. Moreover, ions of an n-type dopant such as Si are implanted into parts of the n-AlGaN electron supply layer 4 and i-GaN electron transit layer 3 which are to underlie the common electrode 18 that serve as the source electrode 7 of the normally-on HEMT 1 and the drain electrode 17 of the normally-off HEMT 2 and into parts of the n-AlGaN electron supply layer 13 and p-GaN electron transit layer 12 which are to be on the side of the common electrode 18 that serve as the source electrode 7 of the normally-on HEMT 1 and the drain electrode 17 of the normally-off HEMT 2. Then, an activation treatment such as a heat treatment is carried out to form the n-type contact regions 9A to 9D that are n-doped regions. Through this process, an npn structure is imparted to the normally-off HEMT 2.

Figure 3C:
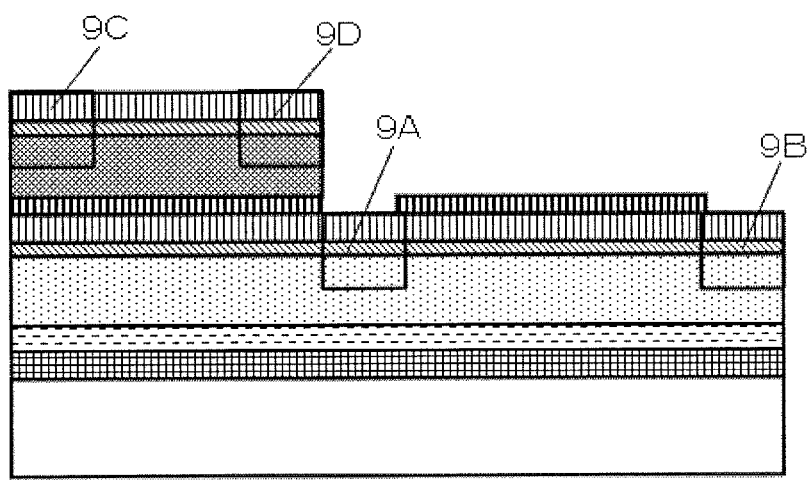

In the case where the semi-insulating SiC substrate 20 is prepared as a semiconductor substrate and where the nucleation layer 21, the buffer layer 22, the i-GaN layer 3 that serves as the first electron transit layer, the i-AlGaN layer 23 that serves as the first spacer layer, the n-AlGaN layer 4 that serves as the first electron supply layer, the AlN layer 10 that serves as the p-type-dopant-diffusion-blocking layer, the p-GaN layer 12 that serves as the second electron transit layer, the i-AlGaN layer 24 that serves as the second spacer layer, and the n-AlGaN layer 13 that serves as the second electron supply layer are formed so as to overlie the semiconductor substrate, ions of an n-type dopant such as Si are implanted into parts of the n-AlGaN electron supply layer 4, i-AlGaN first spacer layer 23, and i-GaN electron transit layer 3 which are to underlie the drain electrode 8 of the normally-on HEMT 1. Ions of an n-type dopant such as Si are implanted into parts of the n-AlGaN electron supply layer 13, i-AlGaN second spacer layer 24, and p-GaN electron transit layer 12 which are to underlie the source electrode 16 of the normally-off HEMT 2. Ions of an n-type dopant such as Si are implanted into parts of the n-AlGaN electron supply layer 4, i-AlGaN first spacer layer 23, and i-GaN electron transit layer 3 which are to underlie the common electrode 18 that serve as the source electrode 7 of the normally-on HEMT 1 and the drain electrode 17 of the normally-off HEMT 2 and into parts of the n-AlGaN electron supply layer 13, i-AlGaN second spacer 24, and p-GaN electron transit layer 12 which are to be on the side of the common electrode 18 that serve as the source electrode 7 of the normally-on HEMT 1 and the drain electrode 17 of the normally-off HEMT 2. Then, an activation treatment such as a heat treatment is carried out to form the n-type contact regions 9A to 9D that are n-doped regions. Through this process, an npn structure is imparted to the normally-off HEMT 2. In this case, the structure illustrated in FIG. 3C is provided.

Without forming the n-type contact regions 9A and 9B, for instance, part of the n-AlGaN electron supply layer 4 right under the position at which the drain electrode of the normally-on HEMT 1 is to be formed and part of the n-AlGaN electron supply layer 4 right under the position at which the common electrode 18 is to be formed may be removed, the common electrode 18 serving as the source electrode 7 of the normally-on HEMT 1 and the drain electrode 17 of the normally-off HEMT 2.

Although not illustrated, a resist mask having an opening corresponding to a device isolation region is formed by, for instance, photolithography, and device isolation is carried out by, for example, dry etching with a chlorine-based gas or ion implantation through the resist mask. Then, as illustrated in FIG. 2D, the drain electrode 8 of the normally-on HEMT 1, the source electrode 16 of the normally-off HEMT 2, and the common electrode 18 that serves as the source electrode 7 of the normally-on HEMT 1 and the drain electrode 17 of the normally-off HEMT 2 are formed. In particular, the drain electrode 8 of the normally-on HEMT 1 is formed on the first nitride semiconductor laminate 5 of the normally-on HEMT 1, the source electrode 16 of the normally-off HEMT 2 is formed on the second nitride semiconductor laminate 14 of the normally-off HEMT 2, and the common electrode 18 that serves as the source electrode 7 of the normally-on HEMT 1 and the drain electrode 17 of the normally-off HEMT 2 is formed on the first nitride semiconductor laminate 5 of the normally-on HEMT 1 so as to be positioned on the side of the second nitride semiconductor laminate 14 of the normally-off HEMT 2.

Ta and Al are deposited in sequence in a region in which the drain electrode 8 of the normally-on HEMT 1 is to be formed, a region in which the source electrode 16 of the normally-off HEMT 2 is to be formed, and a region in which the common electrode 18 that serves as the source electrode 7 of the normally-on HEMT 1 and the drain electrode 17 of the normally-off HEMT 2 is to be formed by, for example, photolithography and a deposition and lift-off technique, thereby forming the drain electrode 8, source electrode 16, and common electrode 18 of Ta/Al, respectively. In particular, the drain electrode 8, source electrode 16, and common electrode 18 are formed of Ta/Al so as to contact the n-type contact regions 9B, 9C, and 9A and 9D formed as described above, respectively. In this case, for instance, Ta is deposited to a thickness of approximately 20 nm, and Al is deposited to a thickness of approximately 200 nm. Then, for example, the product is heated in a nitrogen atmosphere at approximately 400° C. to 1000° C. (for instance, 550° C.) to develop ohmic characteristics. In the first embodiment, the common electrode 18 is formed of the same metal as used for forming the drain electrode 8 and the second source electrode 16 in this manner.

Figure 4A:
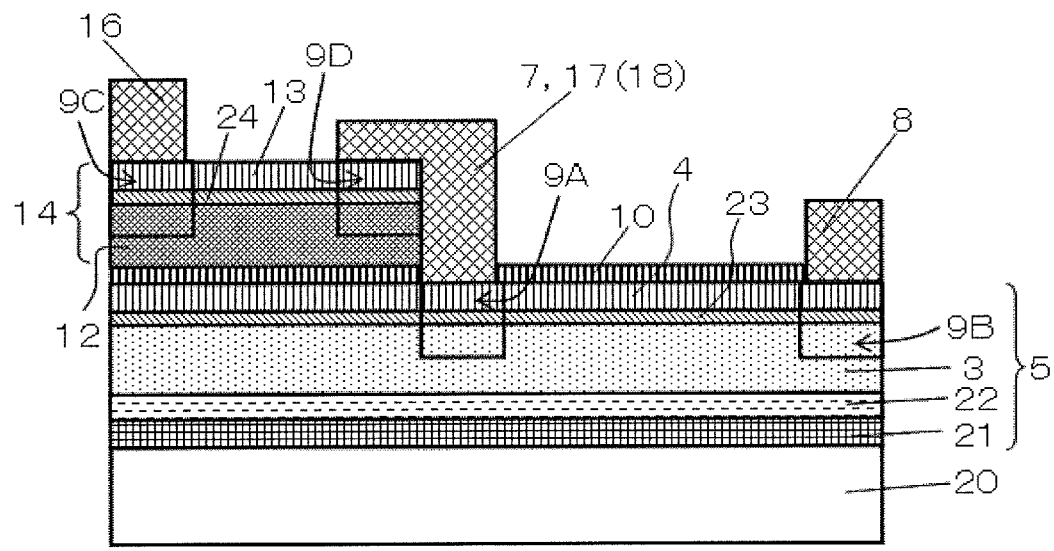
FIGS. 4A and 4B are schematic cross-sectional views illustrating the method for manufacturing a semiconductor device according to the modification of the first embodiment and the configuration of the semiconductor device.
Figure 4B:
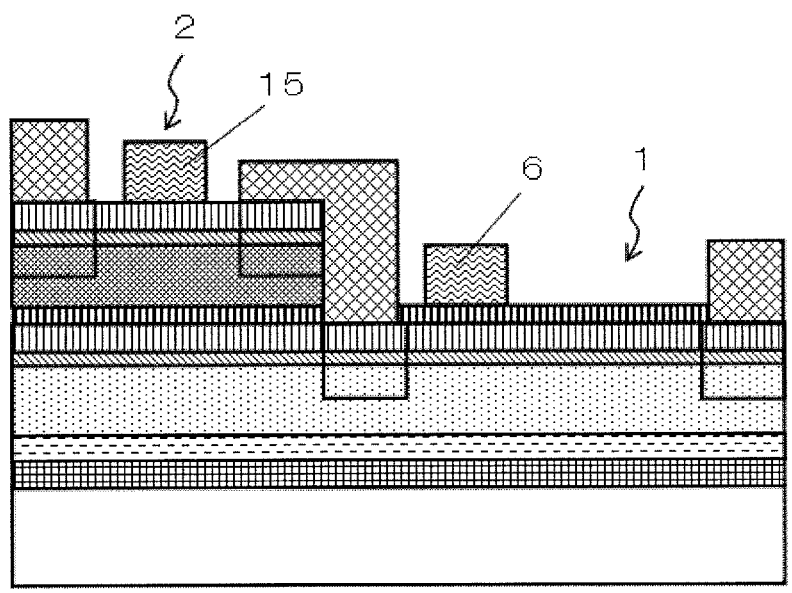

In the case where the semi-insulating SiC substrate 20 is prepared as a semiconductor substrate and where the nucleation layer 21, the buffer layer 22, the i-GaN layer 3 that serves as the first electron transit layer, the i-AlGaN layer 23 that serves as the first spacer layer, the n-AlGaN layer 4 that serves as the first electron supply layer, the AlN layer 10 that serves as the p-type-dopant-diffusion-blocking layer, the p-GaN layer 12 that serves as the second electron transit layer, the i-AlGaN layer 24 that serves as the second spacer layer, and the n-AlGaN layer 13 that serves as the second electron supply layer are formed so as to overlie the semiconductor substrate, the drain electrode 8 of the normally-on HEMT 1, the source electrode 16 of the normally-off HEMT 2, and the common electrode 18 that serves as the source electrode 7 of the normally-on HEMT 1 and the drain electrode 17 of the normally-off HEMT 2 are formed, thereby providing the structure illustrated in FIG. 4A. The common electrode 18 that serves as the source electrode 7 of the normally-on HEMT 1 and the drain electrode 17 of the normally-off HEMT 2 may have a shape illustrated in FIG. 2D or a shape illustrated in FIG. 4A. In other words, the common electrode 18 that serves as the source electrode 7 of the normally-on HEMT 1 and the drain electrode 17 of the normally-off HEMT 2 may be formed so as to contact the n-type contact region 9D of the normally-off HEMT 2 only on the side surface thereof or on both the side surface and upper surface thereof.

Then, as illustrated in FIG. 2D, for example, an SiN film 11 (passivation film, gate insulator, or insulating film) is formed on the surface of the product, and the gate electrode 6 of the normally-on HEMT 1 and the gate electrode 15 of the normally-off HEMT 2 are subsequently formed on the SiN film 11. In this case, an MIS structure has been formed. In particular, the gate electrode 6 of the normally-on HEMT 1 is formed above the first nitride semiconductor laminate 5 of the normally-on HEMT 1, and the gate electrode 15 of the normally-off HEMT 2 is formed above the second nitride semiconductor laminate 14 of the normally-off HEMT 2. In this case, the gate electrode 15 of the normally-off HEMT 2 is formed above the p-type-dopant-containing region of the p-GaN electron transit layer 12 included in the second nitride semiconductor laminate 14 of the normally-off HEMT 2, namely, above the region other than the regions doped with the n-type dopant.

Ni and Au are deposited in sequence in regions in which the gate electrodes are to be formed by, for example, photolithography and a deposition and lift-off technique, thereby forming the gate electrodes 6 and 15 of Ni/Au. In this case, for instance, Ni may be deposited to a thickness of approximately 30 nm, and Au may be deposited to a thickness of approximately 400 nm. In the case where the semi-insulating SiC substrate 20 is prepared as a semiconductor substrate and where the nucleation layer 21, the buffer layer 22, the i-GaN layer 3 that serves as the first electron transit layer, the i-AlGaN layer 23 that serves as the first spacer layer, the n-AlGaN layer 4 that serves as the first electron supply layer, the AlN layer 10 that serves as the p-type-dopant-diffusion-blocking layer, the p-GaN layer 12 that serves as the second electron transit layer, the i-AlGaN layer 24 that serves as the second spacer layer, and the n-AlGaN layer 13 that serves as the second electron supply layer are formed so as to overlie the semiconductor substrate, forming the gate electrode 6 of the normally-on HEMT 1 and the gate electrode 15 of the normally-off HEMT 2 without formation of the SiN film 11, in other words, formation of a Schottky structure provides the structure illustrated in FIG. 4B.

Then, the drain electrode 8 of the normally-on HEMT 1 and the gate electrode 15 and source electrode 16 of the normally-off HEMT 2 are connected to, for instance, wires and pads. In addition, the gate electrode 6 of the normally-on HEMT 1 is electrically connected to the source electrode 16 of the normally-off HEMT 2 to establish cascode connection of the normally-on HEMT 1 to the normally-off HEMT 2.

In this manner, manufacturing of the semiconductor device of the first embodiment has been completed, in which the normally-off HEMT 2 is disposed higher than the normally-on HEMT 1 with the p-type-dopant-diffusion-blocking layer 10 interposed therebetween and in which the normally-on HEMT 1 has been cascode-connected to the normally-off HEMT 2. In the first embodiment, the SiC substrate 20 is used as an example of the semiconductor substrate, but the semiconductor substrate is not limited thereto; for example, other substrates such as semiconductor substrates including a sapphire substrate, a Si substrate, and a GaN substrate may be used. Furthermore, in the first embodiment, the substrate 20 is a semi-insulating substrate but not limited thereto; for instance the substrate 20 may be an n-type conductive substrate or a p-type conductive substrate.

The above-mentioned layered structure including the source electrode 16, the drain electrode 8, the common electrode 18, and the gate electrodes 6 and 15 is an example, and other layered structures may be employed without limitation. The above-mentioned structure including the layers of the source electrode 16, the drain electrode 8, the common electrode 18, and the gate electrodes 6 and 15 may be, for example, a single layer structure or a multilayer structure. The above-mentioned processes for forming the source electrode 16, the drain electrode 8, the common electrode 18, and the gate electrodes 6 and 15 are merely an example and may be formed through any other process.

Although a heat treatment is carried out to develop the ohmic characteristics of the source electrode 16, drain electrode 8, and common electrode 18, the ohmic characteristics may be developed by any other technique; in the case where the ohmic characteristics are developed without a heat treatment, the heat treatment to develop the ohmic characteristics of the source electrode 16, drain electrode 8, common electrode 18 may be omitted. In the first embodiment, although the gate electrodes 6 and 15 are not subjected to a heat treatment, the gate electrodes 6 and 15 may be subjected to a heat treatment.

The semiconductor device and the method for manufacturing the semiconductor device according to the first embodiment provide an advantageous effect in which operation in a normally-off mode is enabled while a low on-resistance and a high withstand voltage are enhanced. The configuration of the semiconductor device and the method for manufacturing the semiconductor device according to the first embodiment may be modified as described below without limitation. A first modification will now be described with reference to FIGS. 5A and 5B.

Figure 5A:
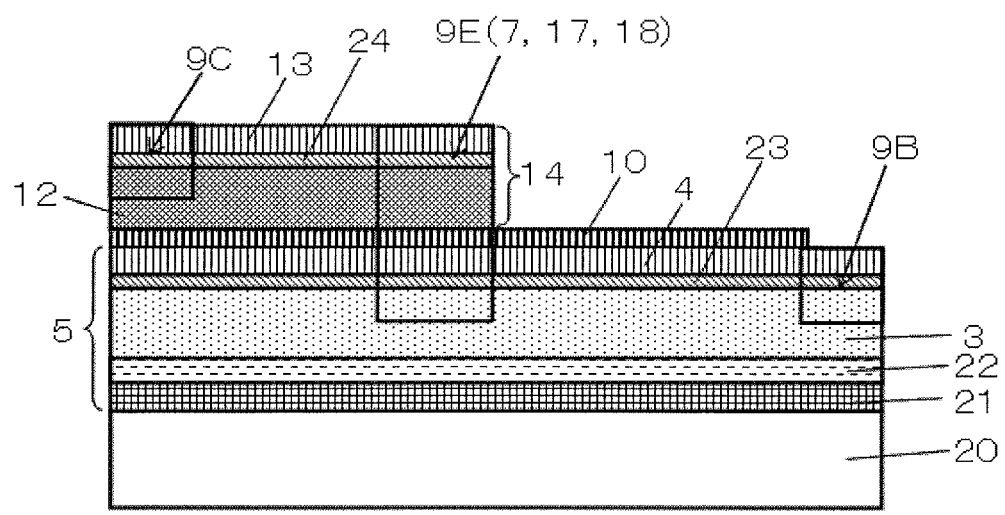
FIGS. 5A and 5B are schematic cross-sectional views illustrating a method for manufacturing a semiconductor device according to a first modification of the first embodiment and the configuration of the semiconductor device.
Figure 5B:
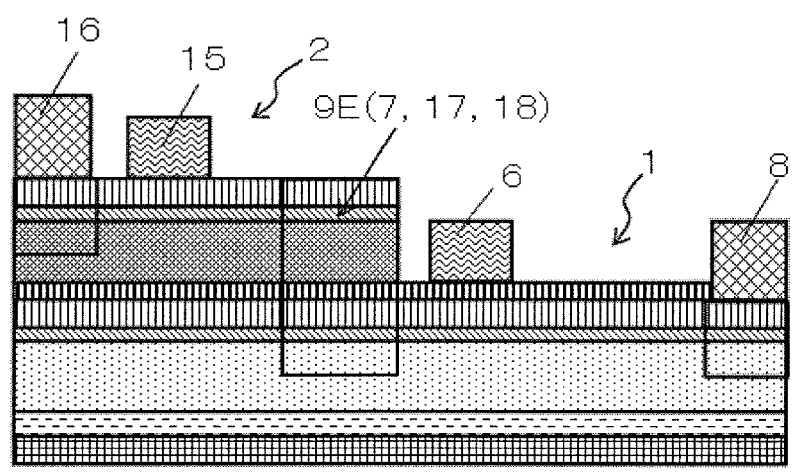

The first modification is different from the first embodiment in that the common electrode 18 that serves as the source electrode 7 of the normally-on HEMT 1 and the drain electrode 17 of the normally-off HEMT 2 is not an metal electrode but an n-doped region 9E as illustrated in FIG. 5B. In the first modification, for example, the semi-insulating SiC substrate 20 is prepared as a semiconductor substrate, and the nucleation layer 21, the buffer layer 22, the i-GaN layer 3 that serves as the first electron transit layer, the i-AlGaN layer 23 that serves as the first spacer layer, the n-AlGaN layer 4 that serves as the first electron supply layer, the AlN layer 10 that serves as the p-type-dopant-diffusion-blocking layer, the p-GaN layer 12 that serves as the second electron transit layer, the i-AlGaN layer 24 that serves as the second spacer layer, and the n-AlGaN layer 13 that serves as the second electron supply layer are formed so as to overlie the semiconductor substrate.

In the first modification, the n-doped region 9E that is the common electrode 18 may be formed as follows: part of the AlN layer 10, which serves as the p-type-dopant-diffusion-blocking layer, belonging to a region which is to be formed into the source electrode in a region in which the normally-on HEMT is to be formed is not removed by etching; ions of an n-type dopant such as Si are implanted into a region which is to be formed into a common electrode that serves as the source electrode 7 of the normally-on HEMT 1 and the drain electrode 17 of the normally-off HEMT 2 as illustrated in FIG. 5A; and an activation treatment such as a heat treatment is carried out. In other words, the n-doped region 9E (region into which ions of an n-type dopant have been implanted) that serves as the common electrode 18 may be formed as follows: in a region which is to be formed into the common electrode 18 that serves as the source electrode 7 of the normally-on HEMT 1 and the drain electrode 17 of the normally-off HEMT 2, ions of an n-type impurity such as Si are implanted into parts of the n-AlGaN electron supply layer 13, i-AlGaN second spacer layer 24, and p-GaN electron transit layer 12 of the normally-off HEMT 2; part of the AlN impurity-diffusion-blocking layer 10; and parts of the n-AlGaN electron supply layer 4, i-AlGaN first spacer layer 23, and i-GaN electron transit layer 3 of the normally-on HEMT 1; and then an activation treatment such as a heat treatment is carried out. In this manner, the common electrode 18 may be the n-doped region 9E extending from the surface of the second nitride semiconductor laminate 14 (in the first modification, the surface of the n-AlGaN electron supply layer 13) of the normally-off HEMT 2 to the i-GaN electron transit layer 3 (first electron transit layer) included in the first nitride semiconductor laminate 5 of the normally-on HEMT 1. In other words, the n-doped region 9E extending from the surface of the second nitride semiconductor laminate 14 to the i-GaN electron transit layer 3 (first electron transit layer) included in the first nitride semiconductor laminate 5 of the normally-on HEMT 1 may be formed as the common electrode 18. As illustrated in FIG. 5A, the n-doped region 9E that serves as the common electrode 18 may be formed in forming the n-type contact regions 9B and 9C in regions on which the drain electrode 8 of the normally-on HEMT 1 is to be formed and on which the source electrode 16 of the normally-off HEMT 2 is to be formed, respectively. In this case, a process for forming the drain electrode 8 of the normally-on HEMT 1 and the source electrode 16 of the normally-off HEMT 2 is different from a process for forming the common electrode 18 that serves as the source electrode 7 of the normally-on HEMT 1 and the drain electrode 17 of the normally-off HEMT 2. In contrast, in the first embodiment, these electrodes are formed through the same process. Then, as illustrated in FIG. 5B, the drain electrode 8 of the normally-on HEMT 1 and the source electrode 16 of the normally-off HEMT 2 may be formed, and the gate electrode 6 of the normally-on HEMT 1 and the gate electrode 15 of the normally-off HEMT 2 may be formed. The other part of the structure and the detail of the manufacturing method are the same as those in the first embodiment.

A second modification will now be described with reference to FIGS. 6A and 6B. The second modification is different from the first embodiment in that n-type semiconductor layers 25A to 25C are formed as n-type contact layers instead of forming the n-doped regions 9A to 9D as n-type contact regions as illustrated in FIG. 6B. In the second modification, for instance, the semi-insulating SiC substrate 20 is prepared as a semiconductor substrate; the nucleation layer 21, the buffer layer 22, the i-GaN layer 3 that serves as the first electron transit layer, the i-AlGaN layer 23 that serves as the first spacer layer, the n-AlGaN layer 4 that serves as the first electron supply layer, the AlN layer 10 that serves as the p-type-dopant-diffusion-blocking layer, the p-GaN layer 12 that serves as the second electron transit layer, the i-AlGaN layer 24 that serves as the second spacer layer, and the n-AlGaN layer 13 that serves as the second electron supply layer are formed so as to overlie the semiconductor substrate; and n-GaN layers are formed as the n-type semiconductor layers 25A to 25C. The n-type semiconductor layers 25A to 25C are not limited to n-GaN layers and may be, for example, n-InGaN layers.

Figure 6A:
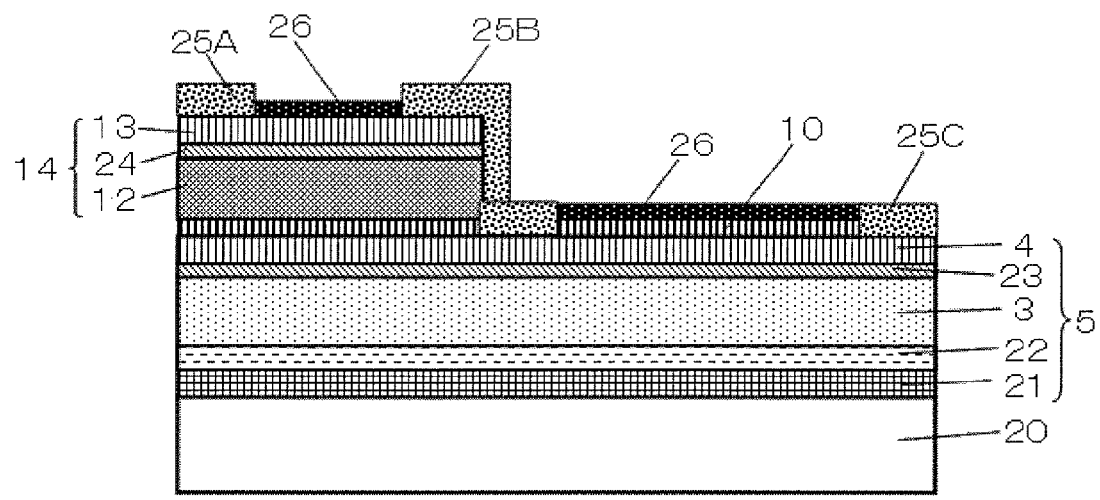
FIGS. 6A and 6B are schematic cross-sectional views illustrating a method for manufacturing a semiconductor device according to a second modification of the first embodiment and the configuration of the semiconductor device.
Figure 6B:
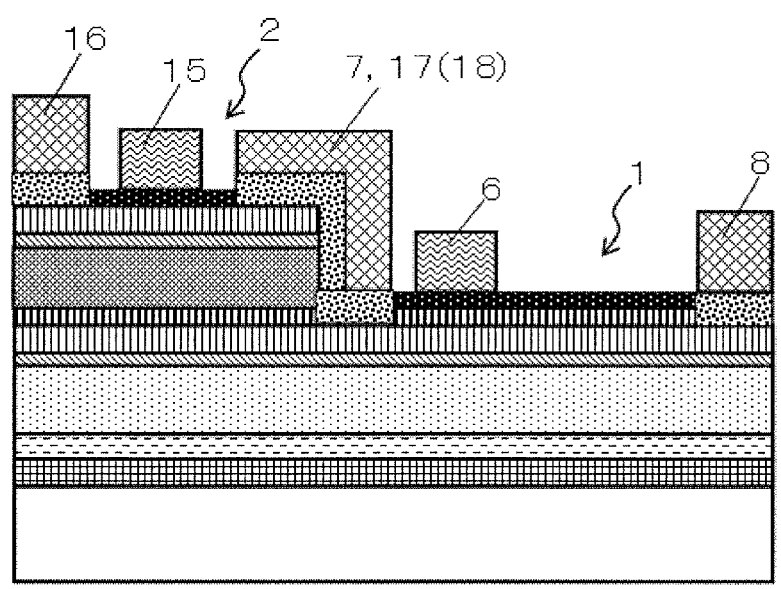

In the second modification, in place of the process for forming the n-type contact regions in the first embodiment (see FIGS. 2C and 3C), as illustrated in FIG. 6A, n-GaN may be grown (regrown) at a position at which the drain electrode 8 of the normally-on HEMT 1 is to be formed, a position at which the source electrode 16 of the normally-off HEMT 2 is to be formed, and a position at which the common electrode 18 that serves as the source electrode 7 of the normally-on HEMT 1 and the drain electrode 17 of the normally-off HEMT 2 is to be formed, thereby forming the n-GaN layers 25A to 25C that are n-type contact layers. In the second modification, the n-GaN layer 25B (n-type semiconductor layer) extending from the surface of the second nitride semiconductor laminate 14 of the normally-off HEMT 2 to the surface of the first nitride semiconductor laminate 5 of the normally-on HEMT 1 may be formed as the n-type contact layer disposed at a position at which the common electrode is to be formed. The n-GaN layers 25A to 25C that are n-type contact layers may be formed, for example, as follows: an SiO$_2$ film 26 having openings corresponding to a region in which the drain electrode 8 of the normally-on HEMT 1 is to be formed, a region in which the source electrode 16 of the normally-off HEMT 2 is to be formed, and a region in which the common electrode 18 that serves as the source electrode 7 of the normally-on HEMT 1 and the drain electrode 17 of the normally-off HEMT 2 is to be formed is formed by photolithography and a thermal CVD method; and n-GaN is epitaxially grown selectively in the openings by, for instance, an MOVPE method on the basis of a characteristic in which GaN is less likely to grow on the SiO$_2$ film 26. Then, as illustrated in FIG. 6B, the source electrode 16 of the normally-off HEMT 2, the common electrode 18 that serves as the source electrode 7 of the normally-on HEMT 1 and the drain electrode 17 of the normally-off HEMT 2, and the drain electrode 8 of the normally-on HEMT 1 may be formed on the n-GaN layers 25A to 25C that are n-type contact layers, respectively; the SiO$_2$ film 26 used as the mask may be left to serve as an insulating film (passivation film or gate insulator); and the gate electrode 6 of the normally-on HEMT 1 and the gate electrode 15 of the normally-off HEMT 2 may be formed on the SiO$_2$ film 26. In this case, an MIS structure has been formed. The other part of the structure and the detail of the manufacturing method are the same as those in the first embodiment.

In the case where the n-type semiconductor layers 25A to 25C are formed as the n-type contact layers in place of forming the n-doped regions 9A to 9D as n-type contact regions in this manner, forming of the metal electrode that is the common electrode 18 that serves as the source electrode 7 of the normally-on HEMT 1 and the drain electrode 17 of the normally-off HEMT 2 may be omitted. In this case, the n-type semiconductor layer 25B replaces the common electrode 18 that serves as the source electrode 7 of the normally-on HEMT 1 and the drain electrode 17 of the normally-off HEMT 2. In other words, the n-type semiconductor layer 25B extending from the surface of the second nitride semiconductor laminate 14 to the surface of the first nitride semiconductor laminate 5 works as the source electrode 7 and drain electrode 17 which are the common electrode 18. In this case, a process for forming the drain electrode 8 of the normally-on HEMT 1 and the source electrode 16 of the normally-off HEMT 2 is different from a process for forming the common electrode 18 that serves as the source electrode 7 of the normally-on HEMT 1 and the drain electrode 17 of the normally-off HEMT 2. In other words, through a process different from the process for forming the drain electrode 8 of the normally-on HEMT 1 and the source electrode 16 of the normally-off HEMT 2, the n-type semiconductor layer 25B that serves as the common electrode 18 and that extends from the surface of the second nitride semiconductor laminate 14 to the surface of the first nitride semiconductor laminate 5 is formed.

In the second modification, although the SiO$_2$ film 26 used as the mask is left to serve as an insulating film to form an MIS structure, the structure of the second modification is not limited thereto; for example, the SiO$_2$ film 26 used as the mask may be removed, and then the gate electrode 6 of the normally-on HEMT 1 and the gate electrode 15 of the normally-off HEMT 2 may be formed. In this case, a Schottky structure is provided. Furthermore, for instance, the SiO$_2$ film 26 used as the mask may be removed, another insulating film (such as SiN film, passivation film, or gate insulator) may be subsequently formed, and the gate electrode 6 of the normally-on HEMT 1 and the gate electrode 15 of the normally-off HEMT 2 may be formed thereon. In this case, an MIS structure is provided.

Second Embodiment

A semiconductor device, a method for manufacturing the semiconductor device, and a power supply according to a second embodiment will now be described with reference to FIGS. 7 and 8.

The semiconductor device of the second embodiment is a semiconductor package including a semiconductor chip that is the semiconductor device of any of the first embodiment and modifications thereof (including a transistor circuit having the normally-on HEMT 1 and normally-off HEMT 2 cascode-connected to each other). The semiconductor chip is also referred to as an HEMT chip or a transistor chip. A discrete package will now be described as an example.

Figure 7:
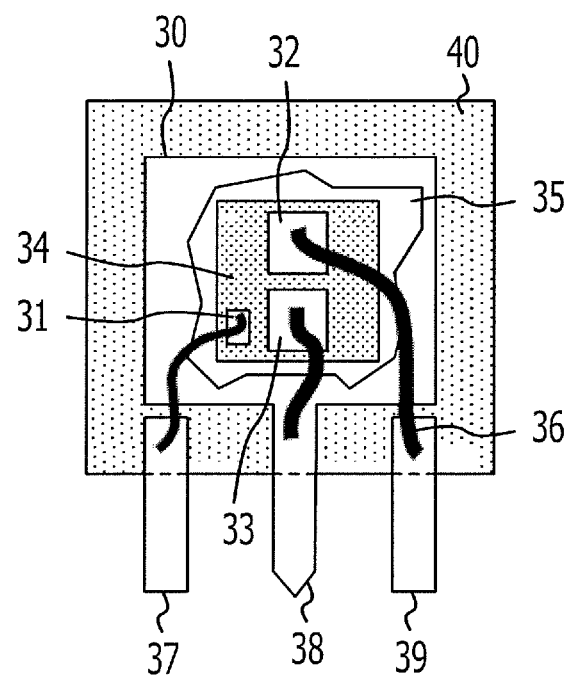
FIG. 7 is a schematic plan view illustrating the configuration of a semiconductor device (semiconductor package) according to a second embodiment.

With reference to FIG. 7, the semiconductor device of the second embodiment includes a semiconductor chip 34 that is the semiconductor device of any of the first embodiment and modifications thereof (including a transistor circuit having the normally-on HEMT 1 and normally-off HEMT 2 cascode-connected to each other), a stage 30 on which the semiconductor chip 34 is disposed, a gate lead 37, a source lead 39, a drain lead 38, bonding wires 36 (hereinafter referred to as Al wires), and a sealing resin 40. The sealing resin is also referred to as a molding resin.

The semiconductor chip 34 disposed on the stage 30 has a gate pad 31, source pad 32, and drain pad 33 which are connected to the gate lead 37, source lead 39, and drain lead 38 through the Al wires 26, respectively, and these are sealed with the resin. In the semiconductor chip 34, the gate electrode 15 and source electrode 16 of the normally-off HEMT 2 and the drain electrode 8 of the normally-on HEMT 1 are connected to the gate pad 31, the source pad 32, and the drain pad 33, respectively. The gate electrode 6 of the normally-on HEMT 1 is electrically connected to the source electrode 16 of the normally-off HEMT 2. Thus, the gate electrode 15 and source electrode 16 of the normally-off HEMT 2 and the drain electrode 8 of the normally-on HEMT 1 are connected to the gate lead 37, the source lead 39, and the drain lead 38 thorough the gate pad 31, the source pad 32, and the drain pad 33, respectively.

The rear surface of the substrate of the semiconductor chip 34 is fixed to the stage 30 with a die-attach material 35 (solder in this case), and the stage 30 is electrically connected to the drain lead 38. The second embodiment is not limited to such a structure, and the stage 30 may be electrically connected to the source lead 39. A method for manufacturing a semiconductor device (discrete package) according to the second embodiment will now be described.

The semiconductor chip 34 that is the semiconductor device of any of the first embodiment and modifications thereof is fixed onto the stage 30, for example, with the die-attach material 35 (solder in this case), the stage 30 being a lead frame. Then, the gate pad 31, drain pad 33, and source pad 32 of the semiconductor chip 34 are connected to the gate lead 37, the drain lead 38, and the source lead 39, for example, by bonding with the Al wires 36, respectively.

Then, the product is sealed with a resin through, for instance, a transfer molding process. The lead frame is subsequently removed. The semiconductor device (discrete package) may be manufactured in this manner. Although an example of the discrete package in which the pads 31 to 33 of the semiconductor chip 34 are used as bonding pads for wire bonding has been herein described, the second embodiment is not limited thereto, and semiconductor packages having other configurations may be employed. For instance, a semiconductor package in which the pads of a semiconductor chip are used as bonding pads for wireless bonding such as flip-chip bonding may be employed. Furthermore, wafer-level packages may be employed. Moreover, semiconductor packages other than discrete packages may be employed.

A power supply which includes the above-mentioned semiconductor package having the semiconductor chip 34 including a transistor circuit in which the normally-on HEMT 1 and the normally-off HEMT 2 are cascode-connected to each other will now be described with reference to FIG. 8. The following description is based on an example in which the transistor circuit included in the above-mentioned semiconductor package and having the normally-on HEMT 1 and normally-off HEMT 2 cascode-connected to each other is employed as a power factor correction (PFC) circuit included in a power supply used in a server.

Figure 8:
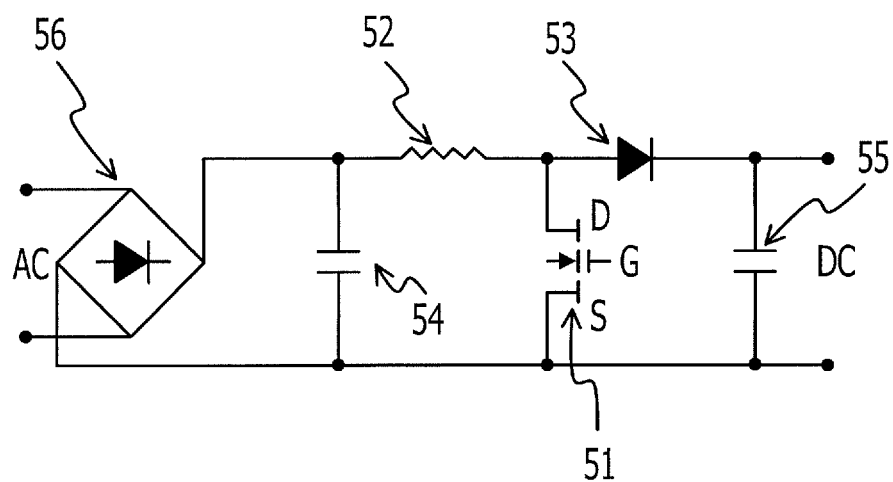
FIG. 8 schematically illustrates the configuration of a power factor correction (PFC) circuit included in a power supply according to the second embodiment.

With reference to FIG. 8, the PFC circuit of the second embodiment includes a diode bridge 56, a choke coil 52, a first capacitor 54, and a transistor circuit 51 included in the above-mentioned semiconductor package, a diode 53, and a second capacitor 55. Since the transistor circuit 51 in which the normally-on HEMT 1 and the normally-off HEMT 2 are cascode-connected to each other as described above has three terminals including the drain electrode 8 of the normally-on HEMT 1 and the source electrode 16 and gate electrode 15 of the normally-off HEMT 2, the transistor circuit 51 is illustrated as a transistor having three terminals of a drain electrode D, a source electrode S, and a gate electrode G in FIG. 8, respectively.

In the PFC circuit of the second embodiment, the diode bridge 56, the choke coil 52, the first capacitor 54, the transistor 51 included in the above-mentioned semiconductor package, the diode 53, and the second capacitor 55 are mounted on a circuit board. In the second embodiment, the drain lead 38, source lead 39, and gate lead 37 of the above-mentioned semiconductor package are inserted into a drain lead inlet, source lead inlet, and gate lead inlet of the circuit board, respectively, and fixed with, for example, solder. In the PFC circuit formed on the circuit board, the connection of the transistor 51 included in the above-mentioned semiconductor package is established in this manner.

In the PFC circuit of the second embodiment, one terminal of the choke coil 52 and the anode terminal of the diode 53 are connected to the drain electrode D of the transistor 51 (drain electrode 8 of normally-on HEMT 1 in this case, see FIG. 1). The other terminal of the choke coil 52 is connected to one terminal of the first capacitor 54, and the cathode terminal of the diode 53 is connected to one terminal of the second capacitor 55. The other terminal of the first capacitor 54, the source electrode S of the transistor 51 (source electrode 16 of normally-off HEMT 2 in this case, see FIG. 1), and the other terminal of the second capacitor 55 are grounded. Both the terminals of the first capacitor 54 are also connected to a pair of terminals of the diode bridge 56, and the other pair of terminals of the diode bridge 56 are connected to input terminals to which alternating current (AC) voltage is applied. Both the terminals of the second capacitor 55 are also connected to output terminals from which direct current (DC) voltage is output. The gate electrode G of the transistor 51 (gate electrode 15 of normally-off HEMT 2 in this case, see FIG. 1) is connected to a gate driver (not illustrated). In the PFC circuit of the second embodiment, the transistor 51 is driven by a gate driver to convert AC voltage applied from the input terminals into DC voltage, and the DC voltage is output from the output terminals.

The power supply of the second embodiment thus has an advantageous effect of an enhancement in reliability. In particular, the semiconductor chip 34 that is the semiconductor device of any of the first embodiment and modifications thereof is used in the power supply, which advantageously enables high reliability to be imparted to the power supply. In the second embodiment, an example in which the above-mentioned semiconductor device (semiconductor chip or semiconductor package) is used in a PFC circuit included in a power supply used in a server has been described; however, the second embodiment is not limited thereto. The above-mentioned semiconductor device (semiconductor chip or semiconductor package) may be used in, for example, electronic equipment (electronic apparatuses) other than a server, such as computers. Furthermore, the above-mentioned semiconductor device (semiconductor chip or semiconductor package) may be used in any other circuit included in a power supply (for instance, DC-DC converter).

Third Embodiment

A high-frequency amplifier of the third embodiment will now be described with reference to FIG. 9.

The high-frequency amplifier of the third embodiment is a high-frequency amplifier (high-power amplifier) which includes the semiconductor device of any of the first embodiment and modifications thereof. With reference to FIG. 9, the high-frequency amplifier of the third embodiment includes a digital predistortion circuit 41, mixers 42*a* and 42*b*, and a power amplifier 43. The power amplifier is also simply referred to as an amplifier.

The digital predistortion circuit 41 compensates for the nonlinear distortions of input signals. The mixers 42*a* and 42*b* mix the input signals subjected to compensation for nonlinear distortions with alternating current signals. The power amplifier 43 amplifies the input signals mixed with the alternating current signals and includes the semiconductor device of any of the first embodiment and modifications thereof, namely, a semiconductor chip including a transistor circuit in which the normally-on HEMT and the normally-off HEMT have been cascode-connected to each other. The semiconductor chip is also referred to as an HEMT chip or a transistor chip.

Figure 9:
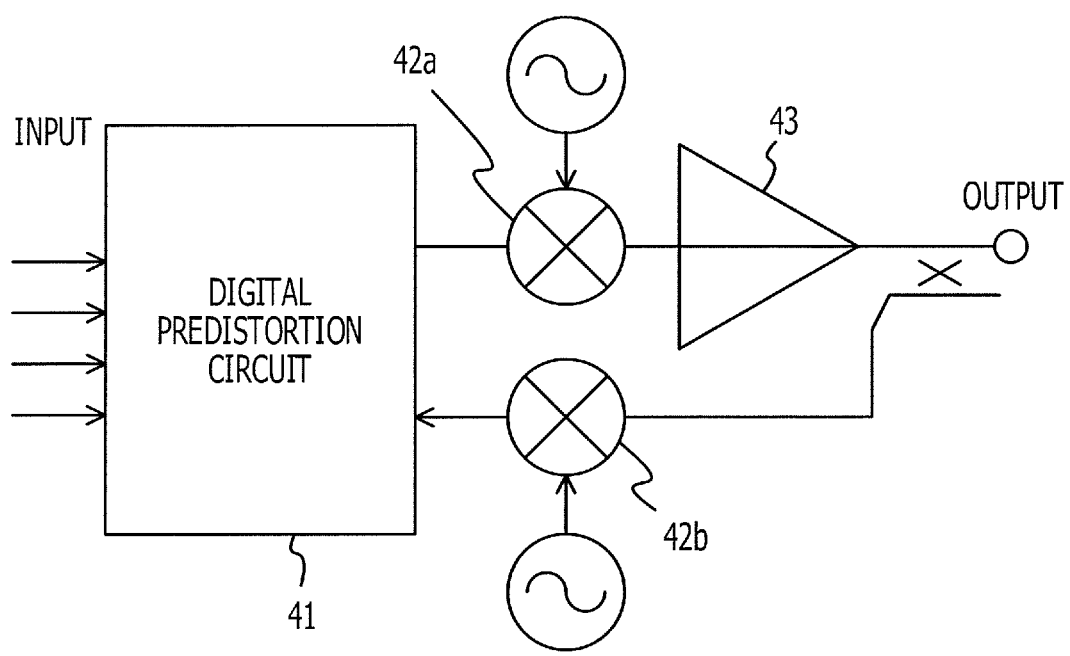
FIG. 9 schematically illustrates the configuration of a high-frequency amplifier according to a third embodiment.

In the configuration illustrated in FIG. 9, for example, switching operation allows the mixer 42*b* to mix output signals with alternating current signals and then transmit the mixed signals to the digital predistortion circuit 41. In the high-frequency amplifier of the third embodiment, the semiconductor device of any of the first embodiment and modifications thereof is applied to the power amplifier 43, which advantageously enables high reliability to be imparted to a high-frequency amplifier.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
   a first transistor that includes a first gate electrode, a first source electrode, a first drain electrode, and a first nitride semiconductor laminate that includes a first electron transit layer and a first electron supply layer;
   a second transistor that includes a second gate electrode, a second source electrode, a second drain electrode, and a second nitride semiconductor laminate that includes a second electrode transit layer and a second electron supply layer, the second drain electrode being a common electrode that also serves as the first source electrode, the second electron transit layer having part that underlies the second gate electrode and that contains a p-type dopant; and
   a p-type-dopant-diffusion-blocking layer,
   wherein
   the second nitride semiconductor laminate is disposed higher than the first nitride semiconductor laminate with the p-type-dopant-diffusion-blocking layer interposed between the first and second nitride semiconductor laminates, and
   the first gate electrode and the second source electrode are electrically coupled to each other to establish cascode connection of the first transistor to the second transistor.

2. The semiconductor device according to claim 1, wherein the first electron supply layer is thicker than the second electron supply layer.

3. The semiconductor device according to claim 1, wherein the distance between the first gate electrode and the first drain electrode is greater than the distance between the first gate electrode and the first source electrode.

4. The semiconductor device according to claim 1, wherein the p-type-dopant-diffusion-blocking layer contains any one of AlGaN and AlN having an Al content of not less than 0.5.

5. The semiconductor device according to claim 1, wherein the common electrode that serves as the first source electrode and the second drain electrode is formed of the same metal as used for forming the first drain electrode and the second source electrode.

6. The semiconductor device according to claim 1, wherein the common electrode that serves as the first source electrode and the second drain electrode is an n-doped region that extends from the surface of the second nitride semiconductor laminate to the first electron transit layer.

7. The semiconductor device according to claim 1, wherein the common electrode that serves as the first source electrode and the second drain electrode is an n-type semiconductor layer that extends from the surface of the second nitride semiconductor laminate to the surface of the first nitride semiconductor laminate.

8. The semiconductor device according to claim 1, wherein
   the first electron transit layer contains GaN,
   the first electron supply layer contains AlGaN,
   the p-type-dopant-diffusion-blocking layer contains any one of AlGaN and AlN,
   the second electron transit layer contains GaN and any one of Be, Mg, Fe, and C as the p-type dopant, and
   the second electron supply layer contains any one of AlGaN, InAlN, and AlInGaN.

9. A power supply comprising:
   a transistor chip that includes
      a first transistor that includes a first gate electrode, a first source electrode, a first drain electrode, and a first nitride semiconductor laminate that includes a first electron transit layer and a first electron supply layer;
      a second transistor that includes a second gate electrode, a second source electrode, a second drain electrode, and a second nitride semiconductor laminate that includes a second electrode transit layer and a second electron supply layer, the second drain electrode being a common electrode that also serves as the first source electrode, the second electron transit layer having part that underlies the second gate electrode and that contains a p-type dopant; and
      a p-type-dopant-diffusion-blocking layer,
   wherein
   the second nitride semiconductor laminate is disposed higher than the first nitride semiconductor laminate with the p-type-dopant-diffusion-blocking layer interposed between the first and second nitride semiconductor laminates, and
   the first gate electrode and the second source electrode are electrically coupled to each other to establish cascode connection of the first transistor to the second transistor.

10. A high-frequency amplifier comprising:
    an amplifier that amplifies an input signal, the amplifier including a transistor chip that includes
       a first transistor that includes a first gate electrode, a first source electrode, a first drain electrode, and a first nitride semiconductor laminate that includes a first electron transit layer and a first electron supply layer;
       a second transistor that includes a second gate electrode, a second source electrode, a second drain electrode, and a second nitride semiconductor laminate that includes a second electrode transit layer and a second electron supply layer, the second drain electrode being a common electrode that also serves as the first source electrode, the second electron transit layer having part that underlies the second gate electrode and that contains a p-type dopant; and a p-type-dopant-diffusion-blocking layer, wherein the second nitride semiconductor laminate is disposed higher than the first nitride semiconductor laminate with the p-type-dopant-diffusion-blocking layer interposed between the first and second nitride semiconductor laminates, and the first gate electrode and the second source electrode are electrically coupled to each other to establish cascode connection of the first transistor to the second transistor.

11. A method for manufacturing a semiconductor device, the method comprising:

forming a first nitride semiconductor laminate that includes a first electron transit layer and a first electron supply layer, a p-type-dopant-diffusion-blocking layer, and a second nitride semiconductor laminate that includes a second electron transit layer and a second electron supply layer, each layer overlying a semiconductor substrate, the second electron transit layer containing a p-type dopant;

removing part of the second nitride semiconductor laminate corresponding to a region in which a first transistor is to be formed, the first transistor including a first gate electrode, a first source electrode, a first drain electrode, and the first nitride semiconductor laminate;

forming the first drain electrode such that the first drain electrode overlies the first nitride semiconductor laminate in the region in which the first transistor is to be formed and forming a second source electrode such that the second source electrode overlies the second nitride semiconductor laminate in a region in which a second transistor is to be formed, the second transistor including a second gate electrode, the second source electrode, a second drain electrode, and the second nitride semiconductor laminate;

forming a common electrode that serves as the first source electrode and the second drain electrode;

forming the first gate electrode such that the first gate electrode overlies the first nitride semiconductor laminate and forming the second gate electrode such that the second gate electrode overlies the second nitride semiconductor laminate; and electrically coupling the first gate electrode to the second source electrode to establish cascode connection of the first transistor to the second transistor.

12. The method according to claim 11, wherein
the first electron supply layer is formed so as to be thicker than the second electron supply layer.

13. The method according to claim 11, wherein
the first gate electrode, the first drain electrode, and the first source electrode are formed such that the distance between the first gate electrode and the first drain electrode is greater than the distance between the first gate electrode and the first source electrode.

14. The method according to claim 11, wherein
the p-type-dopant-diffusion-blocking layer is formed of any one of AlGaN and AlN having an Al content of not less than 0.5.

15. The method according to claim 11, wherein
the common electrode that serves as the first source electrode and the second drain electrode is formed of the same metal as used for forming the first drain electrode and the second source electrode.

16. The method according to claim 11, wherein
an n-doped region that extends from the surface of the second nitride semiconductor laminate to the first electron transit layer is formed as the common electrode that serves as the first source electrode and the second drain electrode.

17. The method according to claim 11, wherein
an n-type semiconductor layer that extends from the surface of the second nitride semiconductor laminate to the surface of the first nitride semiconductor laminate is formed as the common electrode that serves as the first source electrode and the second drain electrode.

18. The method according to claim 11, wherein
the first electron transit layer contains GaN,
the first electron supply layer contains AlGaN,
the p-type-dopant-diffusion-blocking layer contains any one of AlGaN and AlN,
the second electron transit layer contains GaN and any one of Be, Mg, Fe, and C as the p-type dopant, and
the second electron supply layer contains any one of AlGaN, InAlN, and AlInGaN.

* * * * *